United States Patent [19]

Hara et al.

[11] Patent Number: 4,592,801
[45] Date of Patent: Jun. 3, 1986

[54] METHOD OF PATTERNING THIN FILM

[75] Inventors: Shinichi Hara, Hitachi; Shinji Narishige, Mito; Tsuneo Yoshinari, Hitachi; Mistuo Sato, Takahagi; Katsuya Mitsuoka; Makoto Morijiri, both of Hitachi; Masanobu Hanazono, Mito; Tetsuo Kobayashi, Kanagawa, all of Japan

[73] Assignee: Computer Basic Technology Research Association, Tokyo, Japan

[21] Appl. No.: 639,012

[22] Filed: Aug. 9, 1984

[30] Foreign Application Priority Data

Aug. 10, 1983 [JP] Japan ................... 58-144962

[51] Int. Cl.⁴ .............. B44C 1/22; C03C 15/00; C03C 25/06; C23F 1/02
[52] U.S. Cl. ..................... 156/643; 156/646; 156/652; 156/656; 156/659.1; 156/667; 204/192 E; 360/110

[58] Field of Search ............ 156/643, 646, 652, 653, 156/655, 656, 659.1, 661.1, 667; 204/192 EC, 192 E; 427/38, 39, 130–132; 430/313, 317, 318; 360/110, 119, 113, 122, 121, 123; 252/79.1

[56] References Cited

U.S. PATENT DOCUMENTS 4,288,283  9/1981  Umezaki et al. ............ 156/667 X
4,390,394  6/1983  Mathuni et al. ............ 156/667 X

OTHER PUBLICATIONS

J. Appl. Phys. 53(3), Mar. 1982, Fabrication of a Thin Film Head Using Polyimide Resin and Sputtered Ni-Fe Films, Hanazono et al., pp. 2608–2610.

Primary Examiner—William A. Powell
Attorney, Agent, or Firm—Antonelli, Terry & Wands

[57] ABSTRACT

A method of patterning a thin film by dry etching is disclosed in which, in order for a thin alumina film to have a predetermined pattern, the thin alumina film is selectively removed by carrying out the ion beam etching which uses a carbon fluoride gas, while using a photoresist film as a mask.

23 Claims, 17 Drawing Figures

METHOD OF PATTERNING THIN FILM

The present invention relates to a method of patterning a thin film through dry etching techniques.

A thin film technique has been widely used not only for forming the wiring of a semiconductor body such as a large scale integrated circuit but also for fabricating thin film elements such as a magnetic bubble memory element, a thermal printing head, a thin film magnetic head and a liquid crystal display element. In order to fabricate still more elements by the thin film technique, it is required to develop a method for patterning various kinds of thin films, to develop a method for patterning a thin film formed on a step which occurs in a multilayer structure, and to improve the patterning accuracy to 1 $\mu$m or less. However, it is very difficult to satisfy these requirements by the so-called wet etching method (that is, the chemical etching method) in which a substrate having a thin film thereon is immersed into a solution and the thin film dissolves into the solution so as to form a desired thin film pattern, since the wet etching method is unapplicable to a complicated structure and high patterning accuracy cannot be obtained by the wet etching method. Accordingly, in recent years, various dry etching methods have been widely used in which a workpiece is etched in a vacuum vessel by ions generated in a plasma. Of dry etching methods, a method in which argon ions generated in a plasma are taken out of the plasma and are led to a sample chamber separated from a plasma chamber by a grid, to bombard a workpiece disposed in a sample chamber, can remove a thin film on the workpiece by the sputtering action of the argon ion and is applicable to almost all kinds of thin film materials. Therefore, a special attention has been paid to this method, in recent years.

As has been described in, for example, an article entitled "Fabrication of a thin film head using polyimide resin and sputtered Ni-Fe films" (Journal of Applied Physics, Vol. 53, No. 3, Part II, March, 1982, pages 2608 to 2610), a method of patterning a thin film through dry etching techniques has been known in which a thin film is formed all over a surface, and then etched through dry etching techniques using a photoresist mask, to etch off exposed portions of the thin film, thereby forming a desired thin film pattern. This conventional patterning method has some drawbacks as will be mentioned below. It is seldom that a thin film which will be etched so as to have a predetermined pattern, is formed on a flat surface of a thin film element. That is, the thin film is usually formed on a surface having uneveness or a step. Accordingly, when a photoresist film is formed on the thin film, the photoresist film becomes thick at a lower portion of the surface having the unevenness or step, and becomes thin at a higher portion of the surface. It is required for the thinnest portion of the photoresist film to have enough thickness to act as a mask for dry etching. Accordingly, the mean thickness of the photoresist film is far greater, as compared with the thickness of a photoresist film formed on a flat thin film. In the case where the photoresist film used as a mask for dry etching is thick, exposed portions of the thin film which exist in close proximity to the mask, are left unetched, when the thin film is subjected to dry etching. Thus, the patterning accuracy is lowered. Further, a portion of the etched thin film is deposited on the unetched portion of the thin film, and thus a flat thin pattern is not obtained.

It is an object of the present invention to provide a method of patterning a thin film in which a thin film pattern can be formed on a surface having unevenness or a step, with high accuracy.

It is another object of the present invention to provide a method of patterning a thin film in which a thin film pattern can be formed accurately through dry etching techniques.

A characteristic feature of a thin-film patterning method according to the present invention which can attain the above objects, resides in removing an alumina film through a reactive ion beam etching technique using a carbon fluoride gas, while using a photoresist film as a mask. This is based upon a discovery that an alumina film can be selectively etched by bombarding the alumina film with ions which are produced by ionizing carbon fluoride gases such as $CF_4$ and $C_2F_6$ and then accelerated, while using a photoresist film as a mask.

Another characteristic feature of a thin-film patterning method according to the present invention resides in removing a metal film through an ion beam etching techniques using argon, while using an alumina film as mask. This is based upon a discovery that a metal film can be selectively etched by bombarding the metal film with accelerated argon ions, while using an alumina film as a mask.

Incidentally, the term "reactive ion beam etching technique" means an etching method in which reactive ions are accelerated, and a sample to be etched is bombarded with the accelerated ion. The reactive ion beam etching is often called "ion milling", "ion shower etching", or "ion beam etching".

The present invention will be apparent from the following detailed description taken in conjunction with the accompanying drawings, in which.

Figure 1:
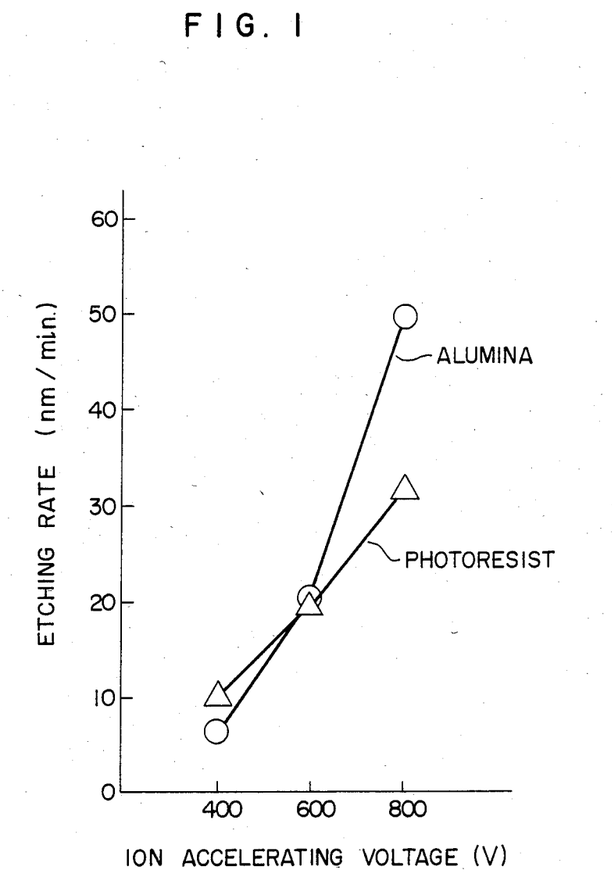
FIG. 1 is a graph showing relationships between ion accelerating voltage and etching rate in the case where a photoresist film and an alumina film are etched by an ion beam etching technique using a carbon fluoride gas.

FIG. 1 shows examples of the etching rate for a photoresist film made of a novolak-type resin and an alumina film in the case where these films are subjected to reaction ion beam etching in a manner as bombarded with an ion which is produced in ionizing carbon tetrafluoride $CF_4$ and then accelerated. In FIG. 1, a mark $\Delta$ indicates the etching rate for the photoresist film, and another mark the etching rate for the alumina film. As is apparent from FIG. 1, the etching rate for the alumina film is smaller than that for the photoresist film, when an ion accelerating voltage is low. However, the former etching rate becomes greater than the latter etching rate when an ion accelerating voltage is increased to 600 V or more. Further, in the case where the photoresist film and alumina film are bombarded with the generally-used argon ion, the etching rate for the photoresist film has substantially the same values as shown in FIG. 1, but the etching rate for the alumina film is one-half the etching rate for the photoresist film or less. Therefore, carbon tetrafluoride is considered to chemically promote the etching for the alumina film.

On the other hand, it is impossible to practically etch an alumina film by a reactive sputter etching technique using carbon tetrafluoride or other carbon fluoride gases. A material which can be etched by reactive sputter etching or plasma etching, is required to produce a compound having a high vapor pressure, by the reaction with the above reactive gas. In other words, the material is required to produce a compound having a low boiling point. For example, silicon tetrafluoride $SiF_4$ which is produced when silicon is etched by a plasma containing carbon tetrafluoride $CF_4$ or other carbon fluoride gases, sublimates at $-95.5°$ C. and aluminum trichloride $AlCl_3$ which is produced when aluminum is etched by a plasma containing carbon tetrachloride $CCl_4$, other carbon chloride gases or other complex containing chlorine has a boiling point of $182.7°$ C. (at a pressure of 755 mmHg). In contrast to these compounds, aluminum trifluoride $AlF_3$ sublimates at a high temperature (namely, $1260°$ C.). This is the reason why an alumina film cannot be etched by the plasma etching technique using a carbon fluoride gas.

The experimental results shown in FIG. 1 are considered to be ascided to the following mechanism, though some remain unexplained. The surface of an alumina film is bombarded with a fragment ion $CF_3^+$ which is produced when $CF_4$ molecule is ionized, and is changed into aluminum trifluoride $AlF_3$. Alumina $Al_2O_3$ has a melting point of $2015°$ C. and a boiling point of $3500°$ C. It will be hard to etch the alumina film having such a high boiling point. However, the etching rate for the alumina film can be increased by such a process as alumina is changed into aluminum trifluoride $AlF_3$ (having a sublimation temperature of $1260°$ C.) by the bombardment of the $CF_3^+$ ion. The experimental fact that the dependence of etching rate for alumina on ion accelerating voltage is remarkable, suggests that the reaction of $Al_2O_3$ with the $CF_3^+$ ion occurring only in the surface of the alumina film is a rate-determining stage of an etching process.

As can be seen from FIG. 1, when the ion accelerating voltage is made high, the alumina film can be selectively etched by using the photoresist film as a mask.

Figure 2:
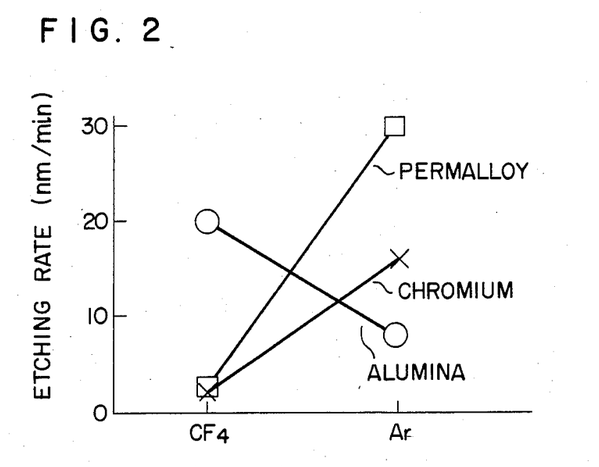
FIG. 2 is a graph showing relationships between discharge gas and etching rate in the case where a permalloy film, a chromium film and an alumina film are etched by ion beam etching techniques.

Although the case where the photoresist and alumina films are bombarded with an ion which is produced in ionizing $CF_4$ and then accelerated, has been explained with reference to FIG. 1, it is to be noted that even when other carbon fluoride gases such as $C_2F_6$ and $CHF_3$ were used in place of $CF_4$, experimental results similar to those shown in FIG. 1 were obtained on the basis of the above-mentioned reaction process. FIG. 2 shows the etching rate for a permalloy film, a chromium film and an alumina film in the case where these films are subjected to $CF_4$ ion beam etching and argon ion beam etching and an ion accelerating voltage is made equal to 600 V. In FIG. 2, marks □, X, and indicate the etching rate for the permalloy film, that for the chromium film, and that for the alumina film, respectively. As shown in FIG. 2, the etching rate for the alumina film is higher in the case where $CF_4$ is used, than in the case where argon is used. While, the etching rate for the permalloy film and chromium film is higher in the case where argon is used, than in the case where $CF_4$ is used. It is known from the above fact that, when the permalloy or chromium film is selectively etched by using the alumina film as a mask, a mask pattern can be formed and removed by $CF_4$ ion beam etching without producing any adverse effect on the metal film, and the permalloy or chromium film can be selectively etched by argon ion beam etching, without producing any adverse effect on the alumina film acting as the mask. In the above, the selective etching of the permalloy film and chromium film has been explained with reference to FIG. 2, by way of example. Other metal films, for example, an iron film and a nickel film can be selectively etched in a similar manner as mentioned above.

Figure 3:
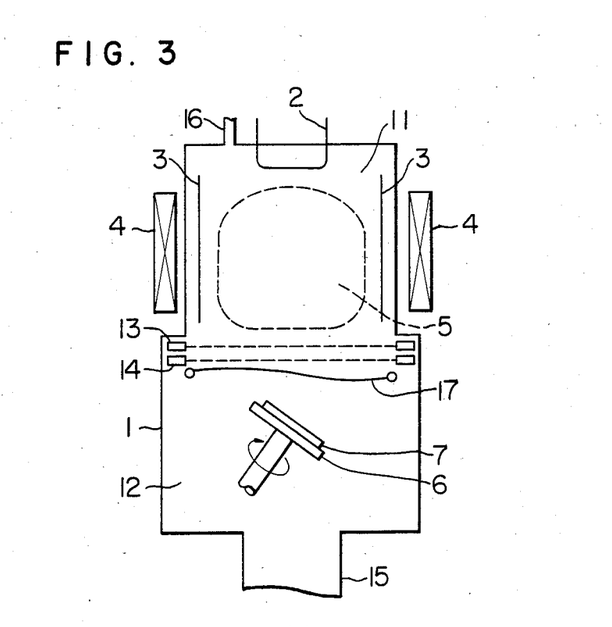
FIG. 3 is a schematic view showing an example of an ion beam etching apparatus.

FIG. 3 shows an example of an ion beam etching apparatus for carrying out a thin-film patterning method according to the present invention. Referring to FIG. 3, a vacuum vessel 1 is divided into an ion gun chamber 11 for generating a plasma to produce, for example, argon ions and a sample chamber 12. Further, grids 13 and 14 are disposed between the ion gun chamber 11 and sample chamber 12. The vacuum vessel 1 is evacuated by a vacuum pump through an exhaust pipe 15 so that the pressure inside the vacuum vessel 1 is $10^{-3}$ to $10^{-7}$ Torr. Argon is introduced into the vacuum vessel 1 through a port 16 at a predetermined flow rate. A filament 2 is disposed in the ion gun chamber 11 to emit thermal electrons, which collide with argon atoms, on the way to a plate 3, thereby ionizing the argon atoms. A coil 4 disposed around the ion gun chamber 11 generates a magnetic field crossing electric field between the filament 2 and plate 3 in the chamber 11 so that the emitted electron makes a long stay in the chamber 11, to enhance the ionization probability of the argon atom, thereby generating a plasma 5. Argon ions produced in the plasma 5 are led into the sample chamber 12 through the grids 13 and 14 on the basis of a potential difference between the ion gun chamber 11 and sample chamber 12, and impinge on a substrate 7 which is placed on a sample holder 6 and is provided with a thin film on its surface. Thus, the thin film having been formed on the substrate 7 is sputtered by the argon ions. When at least a portion of the thin film is covered by a photoresist mask, the thin film can be selectively sputtered. That is, a desired thin film pattern can be formed by using an appropriate photoresist mask. In order to adjust the sputtering efficiency and the contour of a thin film pattern, an angle between the holding surface of the sample holder 6 and the incident direction of the argon ion is made variable, and moreover the sample holder 6 is made rotatable. In order to prevent the surface of the substrate 7 from being charged with the argon ions, a filament 17 serving as a neutralizer emits thermal electrons, to neutralize electric charges on the surface of the substrate 7. The apparatus shown in FIG. 3 is usually called an ion milling apparatus or ion beam etching apparatus. A feature of the above apparatus resides in that the ion gun chamber 11 for generating the plasma 5 is separated from the sample chamber 12 for containing therein the sample holder 6, and ions are accelerated by a potential difference between the ion gun chamber 11 and sample chamber 12. In an ion beam etching apparatus of this kind, the argon ions may be produced in a plasma energized by microwave energy or in a magnetron discharger using parallel plate electrodes. Even when means for generating the argon ion may be changed as mentioned above, the fundamental operation principle of the ion beam etching apparatus is the same as the operation principle having been explained with reference to FIG. 3.

Another feature of an ion beam etching apparatus of this kind resides in that, since an etching operation is based upon a physical sputtering phenomenon, almost all kinds of thin films can be etched. Accordingly, the ion beam etching apparatus is effectively used for patterning a thin film which cannot be etched by a plasma containing carbon tetrafluoride, carbon tetrachloride, oxygen, hydrogen, or others, for example, a permalloy film which is a main member of a magnetic bubble memory element or thin-film magnetic head.

Figure 4A:
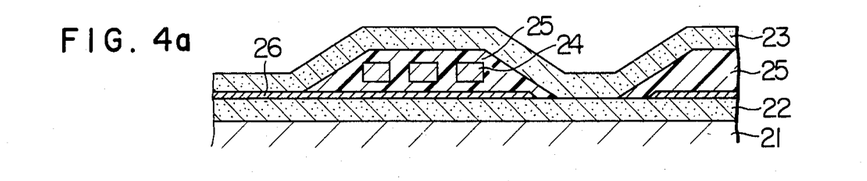
FIGS. 4a to 4e are sectional views showing an example of a process for fabricating a thin-film magnetic head in accordance with the present invention.

FIGS. 4a to 4e show a fabrication process of a thin-film magnetic head according to an embodiment of the inventive thin-film patterning method. Referring to FIG. 4a, lower and upper permalloy films 22 and 23 for forming a magnetic circuit, several turns of coil conductor 24 disposed between the permalloy films 22 and 23 and crossing the magnetic circuit, an organic resin film 25 for insulating adjacent turns of the coil conductor 24 from each other and for insulating each of the permalloy films 22 and 23 from the coil conductor 24, and a gap member 26 interposed between the permalloy films 22 and 23 for forming a magnetic gap and extended to lie also between the lower permalloy film 22 and organic resin film 25, are formed on a substrate 21 through thin film techniques. Although only a portion corresponding to a single magnetic head is shown in FIGS. 4a to 4e, a large number of magnetic heads are simultaneously formed on the substrate 21 having a large area. In the state shown in FIG. 4a, the upper permalloy film 23 is provided not for each magnetic head individually but in common (i.e. continuously). The present invention can exhibit a remarkable effect when the upper permalloy film 23 is divided into parts corresponding to individual magnetic heads.

Figure 4B:
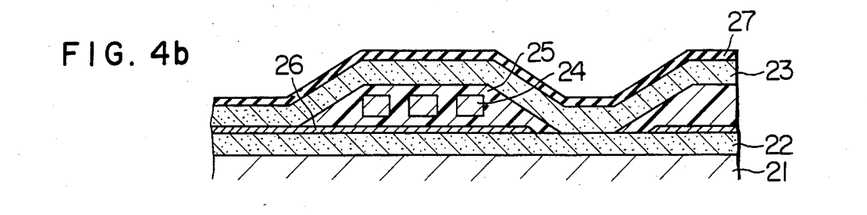

FIG. 4b shows a state that an alumina film 27 has been formed on the whole surface of the upper permalloy film 23 by, for example, sputtering.

Figure 4C:
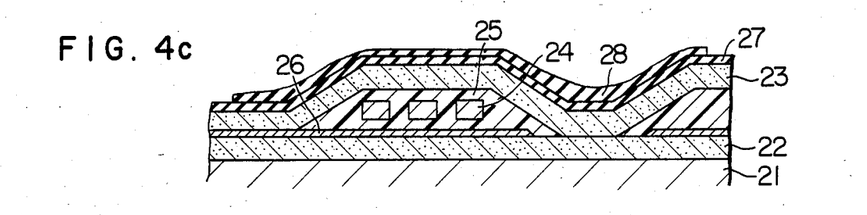

FIG. 4c shows a state that, after a photoresist material was applied to the whole surface of the alumina film 27 to form a photoresist film 28, and the photoresist film 28 has been exposed and developed so as to have a predetermined pattern which is identical with a final pattern of the upper permalloy film 23.

Figure 4D:
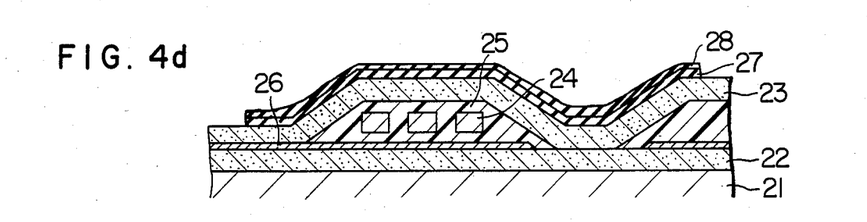

FIG. 4d shows a state that an exposed portion of the alumina film 27 has been dry-etched by using the photoresist film 28 as a mask. The ion beam etching technique using a carbon fluoride gas was used for dry-etching the exposed portion of the alumina film 27. As shown in FIG. 4d, the photoresist film 28 on the remaining portion of the alumina film 27 is left, though the thickness of the film 28 is reduced. The photoresist film 28 does not change in property even after having been subjected to the ion beam etching which uses a carbon fluoride gas, and therefore can be readily removed by an oxygen plasma or an organic solvent such as acetone.

Figure 4E:
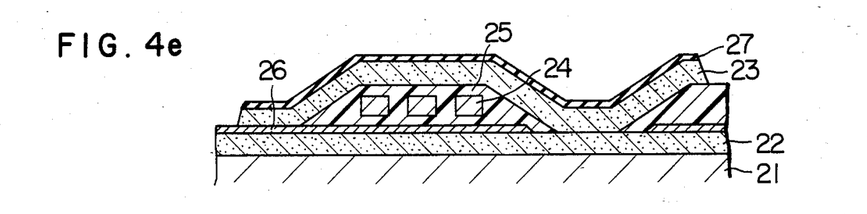

FIG. 4e shows a state that the upper permalloy film 23 has been etched by carrying out argon ion beam etching while using the alumina film 27 as a mask, that is, a state that a patterning operation for the upper permalloy film 23 has been completed. If it is required to remove the alumina film 27 which has been used as the mask, the alumina film 27 will be readily etched off by the ion beam etching which uses a carbon fluoride gas or by phosphoric acid. However, in order to reinforce the thin-film magnetic head, it is usually required to coat the magnetic head with an inorganic oxide material. Accordingly, it is not required to remove the alumina film 27.

According to such a process, when a permalloy film is selectively etched, an alumina film having a large selection ratio is used as a mask. In other words, the etching rate for the permalloy film is far greater than the etching rate for the alumina film. Accordingly, the thickness of the mask (namely, the alumina film) can be selected small. As a result, the pattern accuracy and flatness of the permalloy film can be improved. Since the alumina mask can be thin, a photoresist film for patterning the alumina film can also be thin (in a film). This also improves the pattern accuracy of the permalloy film. Further, the alumina film can be formed by sputtering, and therefore can be formed on a tapered surface with substantially the same thickness as on a flat surface. Since the alumina film having such uniform thickness is used as a mask, the permalloy film having a predetermined pattern can be formed, with high accuracy, even on a surface having unevenness or a step.

FIGS. 5a to 5e show a fabrication process of a thin-film magnetic head according to another embodiment of the inventive thin-film patterning method. The embodiment used in FIGS. 5a to 5e is different from the embodiment used in FIGS. 4a to 4e in that a metal film 29 is provided on the alumina film 27.

Figure 5A:
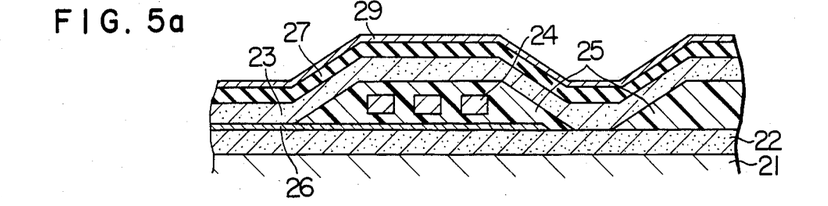
FIGS. 5a to 5e are sectional views showing another example of a process for fabricating a thin-film magnetic head in accordance with the present invention.

FIG. 5a shows a state that the metal film 29 serving as a mask for the alumina film 27 shown in FIG. 4b has been formed on the alumina film 27. In order to enhance the pattern accuracy of the upper permalloy film 23, the alumina film 27 is made smaller in thickness than the upper permalloy film 23, and the metal film 29 is made smaller in thickness than the alumina film 27.

Figure 5B:
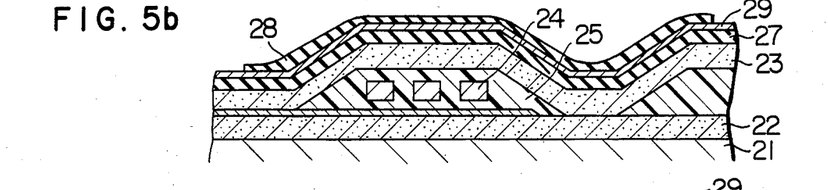

FIG. 5b shows a state that, after the photoresist film 28 was formed on the metal film 29, the film 28 has been exposed and developed so as to have a predetermined pattern.

Figure 5C:
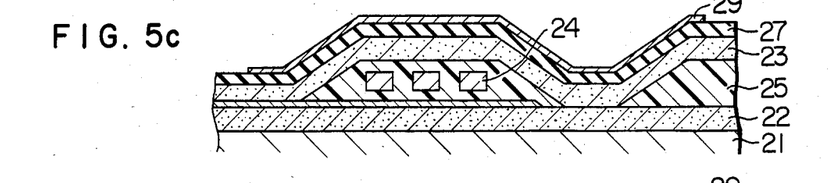

FIG. 5c shows a state that, after the metal film was selectively etched by using the photoresist film 28 as a mask, the remaining photoresist film 28 has been removed.

Figure 5D:
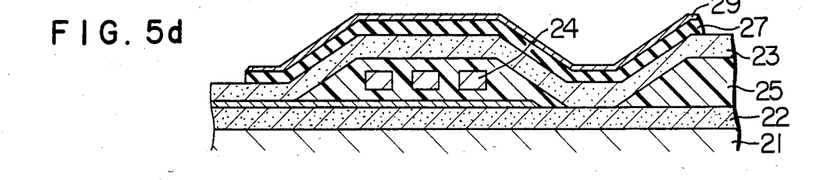

FIG. 5d shows a state that the alumina film 27 has been patterned by carrying out the ion beam etching which uses a carbon fluoride gas, while using the metal film 29 as a mask.

Figure 5E:
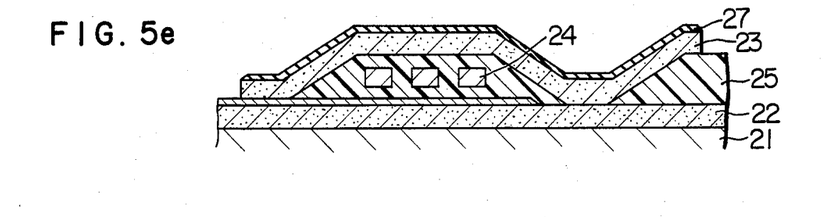

FIG. 5e shows a state that the upper permalloy film 23 has been patterned by carrying out the argon ion beam etching, while using the alumina film 27 as a mask. When the upper permalloy film 23 is selectively etched by the argon ion beam etching, the metal film 29 is etched off, since the thickness of the metal film 29 is very small.

The metal film 29 used in the above process is required not to be readily etched by the ion beam etching which uses a carbon fluoride gas. That is, it is required that when the metal film 29 is subjected to the above ion beam etching, the etching rate for the metal film 29 is small. In order to satisfy the above requirement, it is desirable to make the metal film 29 of a metal capable of satisfying the following two conditions: the fluoride of the metal has a high boiling temperature, and the metal itself has a high boiling point, too. For example, chromium, iron, nickel and others can satisfy the above conditions. Of all metals capable of satisfying these conditions, permalloy which is an iron-nickel alloy, is most favorable from the manufactural point of view since permalloy is also the material of the film 23 to be patterned, and moreover is advantageous in that even if the metal film 29 sputtered by the ion beam etching is deposited on the substrate, the sputtered metal film will scarcely act as a harmful substance.

In the case where the metal film 29 is made of permalloy or other metals having low etching rate by this reactive ion beam etching, the metal film 29 can be thin and be readily etched to a desired shape, avoiding the possibility of permalloy being redeposited on the exposed surface of the magnetic head. Further, the photoresist film 28 is used as a mask for the metal film 29 which is far smaller in thickness than the upper permalloy film 23, and therefore can be made thin. This improves the pattern accuracy of the permalloy film 23. Furthermore, a time required for selectively etching the metal film 29 by using the photoresist film 28 as a mask is short, and therefore a change in pattern dimension due to side etching is suppressed. It has been found that, as a result of these improvements, variations in pattern dimension are ±0.5 μm or less.

A common feature of the two embodiments resides in that at the time of etching the permalloy film, the use of a photoresist mask which is inferior in heat resistance can be avoided and hence an etching period can be reduced by increasing the ion-accelerating voltage and ion current. There can be provided an advantage that, since the alumina film serving as a mask for the permalloy film is hard to be side-etched, an angle between an end face of the permalloy film and the substrate can be made substantially equal to 90°.

In the above embodiments explanation has been made on the case where the permalloy film is patterned by using the alumina film as a mask. However, the etching rate of an argon ion for the alumina film is smaller, as compared with the etching rate for many other materials, and therefore many metal films other than the permalloy film and various kinds of films can be patterned by using the alumina film as a mask.

In the above embodiments, the alumina film used as a mask for the permalloy film has been patterned by the ion beam etching. It is needless to say that alumina films for other usages can be patterned in a similar manner as mentioned above. When the alumina film is patterned by ion beam etching, a photoresist film or metal film may be used as a mask. The use of the metal film as a mask is advantageous in that the edge of the alumina film patterned by using the metal film as a mask is sharper, as compared with the edge obtained by using the photoresist film as a mask. As has been explained in the foregoing, the alumina film is patterned (or etched) by the ion beam etching which uses a carbon fluoride gas. This ion beam etching can shorten a time necessary for etching the alumina film, since the etching rate of a carbon fluoride ion for the alumina film is greater than the etching rate of an argon ion for the alumina film as shown in FIG. 2.

FIGS. 6a to 6d show a fabrication process of a thin-film magnetic head according to a further embodiment of the inventive thin-film patterning method. In a thin-film magnetic head, the upper and lower permalloy films are kept in contact with each other at a place, as shown in, for example, FIGS. 4a to 4e. The present embodiment is concerned with the above contact between the upper and lower permalloy films. Incidentally, FIGS. 6a to 6d are sectional views of the magnetic head shown in FIGS. 4a to 4d, taken along a line perpendicular to the cross section shown in FIG. 4a.

Figure 6A:
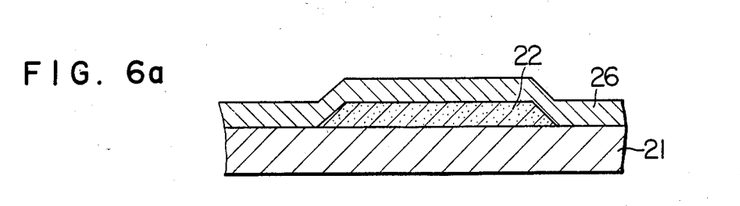
FIGS. 6a to 6d are sectional views showing a further example of a process for fabricating a thin-film magnetic head in accordance with the present invention.
Figure 6B:
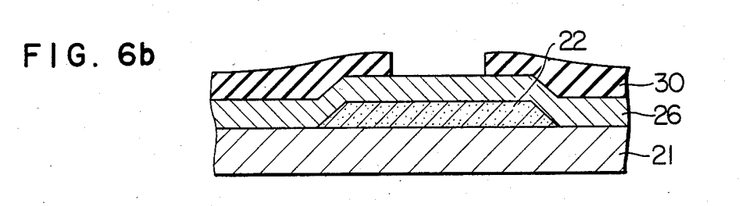
Figure 6C:
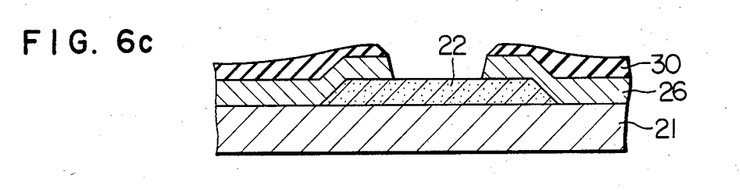
Figure 6D:
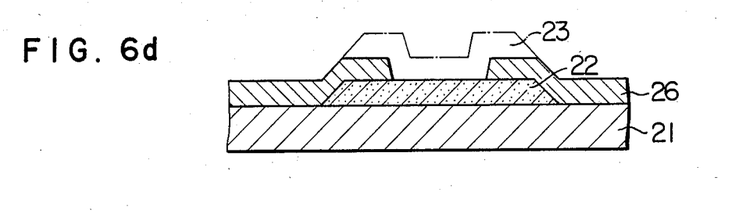

FIG. 6a shows a state that the gap member 26 made of alumina has been provided on the lower permalloy film 22 and substrate 21. FIG. 6b shows a state that after a photoresist film 30 was formed on the gap member 26, the photoresist film 30 has been exposed and developed so as to have a predetermined shape. FIG. 6c shows a state that the gap member 26 has been patterned by carrying out the ion beam etching which uses a carbon fluoride gas, while using the photoresist film 30 as a mask. FIG. 6d shows a state that the photoresist film 30 which acted as the mask, has been removed. Thereafter, the upper permalloy film 23 is formed, as indicated by a dot-dash line in FIG. 6d. The above process is advantageous in that, when the gap member 26 is subjected to the ion beam etching, the lower permalloy film 22 is scarcely etched even if over-etching is made for the gap member 26.

In the foregoing description, explanation has been made on some cases where the present invention is applied to the fabrication of a thin-film magnetic head, by way of example. However, the present invention is not limited to such cases, but is applicable to the fabrication of other thin-film elements.

We claim:

1. A method of forming a thin film of a predetermined pattern on a desired surface having an uneven portion, comprising the steps of:
   (a) forming a thin alumina film on the desired surface, including on the uneven portion;
   (b) forming a photoresist film of a predetermined pattern on said thin alumina film, including on the uneven portion; and
   (c) removing an exposed portion of said thin alumina film by an ion beam etching technique using a carbon fluoride gas, while using said photoresist film as a mask, wherein an ion accelerating voltage during the ion beam etching technique using a carbon fluoride gas is equal to or greater than 600 V.

2. A method of forming a thin film of a predetermined pattern on a desired surface according to claim 1, wherein said carbon fluoride gas is one selected from a group consisting of $CF_4$, $C_2F_6$, and $CHF_3$.

3. A process of forming a thin film magnetic head comprising the steps of:
   (a) forming a thin alumina film on a substrate, said substrate including a permalloy layer to constitute the lower permalloy film of said thin film magnetic head;
   (b) forming a photoresist film of a predetermined pattern on said thin alumina film, said predetermined pattern including openings on the lower permalloy film;
   (c) removing exposed portions of said thin alumina film by an ion beam etching technique using a carbon fluoride gas, herein an ion accelerating voltage during the ion beam etching technique using a carbon fluoride gas is equal to or greater than 600V, thereby exposing portions of said lower permalloy film while substantially not etching said lower permalloy film; and
   (d) forming an upper permalloy film so as to contact exposed portions of said lower permalloy film and to extend on said alumina film.

4. A method of forming a thin film of a predetermined pattern on a desired surface having an uneven portion, comprising the steps of:
   (a) forming a thin metal film on said desired surface, including on the uneven portion;

(b) forming a thin alumina film on said thin metal film, including on the uneven portion;

(c) forming a photoresist film of a predetermined pattern on said thin alumina film, including on the uneven portion;

(d) removing an exposed portion of said thin alumina film by an ion beam etching technique using a carbon fluoride gas, while using said photoresist film as a mask, wherein an ion accelerating voltage during the on beam etching technique using a carbon fluoride gas is equal to or greater than 600V; and (e) removing an exposed portion of said thin metal film by an ion beam etching technique using argon, while using said thin alumina film as a mask.

5. A method of forming a thin film of a predetermined pattern on a desired surface according to claim 4, wherein an ion accelerating voltage used in both of the ion beam etching techniques is equal to or greater than 600V.

6. A method of forming a thin film of a predetermined pattern on a desired surface according to claim 4, wherein sadi carbon fluoride gas is one selected from a group consisting of $CF_4$, $C_2F_6$, and $CHF_3$.

7. A method of forming a thin film of a predetermined pattern on a desired surface according to claim 4, wherein said thin metal film is made of a metal selected from a group consisting of iron, nickel, an iron-nickel alloy, and chromium.

8. A method of forming a thin film of a predetermined pattern on a desired surface having an uneven portion, comprising the steps of:

(a) forming a thin metal film on the desired surface, including on the uneven portion;

(b) forming a thin alumina film of a predetermined pattern on said thin metal film, including on the uneven portion, the thin alumina film of a predetermined pattern being formed utilizing an ion beam etching technique using a carbon fluoride gas, with an ion accelerating voltage used in the ion beam etching technique using carbon fluoride gas being equal to or greater tthan 600V; and (c) removing an exposed portion of said thin metal film by an ion beam etching technique using argon, while using said thin alumina film as a mask.

9. A method of forming a thin film of a predetermined pattern on a desired surface according to claim 8, wherein said thin metal film is made of a metal selected from a group consisting of iron, nickel, an iron-nickel alloy, and chromium.

10. A method of patterning a thin film mainly consisting of a permalloy, chromium or other metals, having uneven portions, comprising the steps of:

successively depositing a first film mainly consisting of permalloy, chromium or other metals on a substrate, said first film having uneven portions, a second film mainly consisting of alumina on the first film, including on the uneven portions thereof, and a third film including a photoresist layer on the second film, including on the uneven portions;

exposing and patterning said third film;

etching said second film using said patterned third film as a mask in an ion-beam etching technique using carbon fluoride, with an ion accelerating voltage used in the ion-beam etching technique using carbon fluoride being equal to or greater than 600V; and etching said first film using said etched second film as a mask in an ion-beam etching technique using argon.

11. A method of forming a thin film of a predetermined pattern on a desired surface according to claim 1, wherein the thin alumina film is formed by sputtering to provide a uniform film on the desired surface, including on the uneven portion.

12. A method of forming a thin film of a predetermined pattern on a desired surface according to claim 11, wherein said photoresist film of a predetermined pattern has a non-uniform thickness, said photoresist film being thicker at a lower portion of the uneven portion of the desired surface, and thinner at a higher portion of the uneven portion.

13. A method of forming a thin film of a predetermined pattern on a desired surface according to claim 1, wherein said photoresist film of a predetermined pattern has a non-uniform thickness, said photoresist film being thicker at a lower portion of the uneven portion of the desired surface, and thinner at a higher portion of the uneven portion.

14. A method of forming a thin film magnetic head, comprising the steps of:

(a) forming a thin alumina film on the top surface of a substrate; said substrate comprising lower and upper permalloy films for forming a magnetic circuit, a coil conductor disposed between the permalloy films and crossing the magnetic circuit, and a gap member interposed between the permalloy films for forming a magnetic gap, said substrate having an uneven surface; said thin alumina film being formed on the upper permalloy film, including on said uneven surface;

(b) forming a photoresist film of a predetermined pattern on said thin alumina film, including on said uneven surface;

(c) removing an exposed portion of the thin alumina film by an ion beam etching technique using a carbon fluoride gas, wherein an ion accelerating voltage during the ion beam etching technique using a carbon fluoride gas is equal to or greater than 600V; and (d) removing an exposed portion of the upper permalloy film by an ion beam etching technique using argon, while using said thin alumina film as a mask.

15. A process of forming a thin film magnetic head according to claim 14, wherein after forming the thin alumina film but prior to forming the photoresist film, a metal film is formed on the thin alumina film, with an exposed portion of said metal film being removed after forming the photoresist film of a predetermined pattern, and wherein the metal film, after removal of the exposed portion thereof, is used as a mask in removing an exposed portion of the thin alumina film.

16. A process of forming a thin film magnetic head according to claim 14, wherein portions of the thin alumina film not removed in step (c) is retained in said magnetic head.

17. A process of forming a thin film magnetic head according to claim 14, wherein said gap is made of alumina.

18. A method of forming a thin film of a predetermined pattern on a desired surface having an uneven portion, comprising the steps of:

(a) forming a thin alumina film on the desired surface including on the uneven portion;

(b) forming a thin metal film on the thin alumina film, including on the uneven portion;

(c) forming a photoresist film of a predetermined pattern on the thin metal film, including on the uneven portion;

(d) removing an exposed portion of the thin metal film, thereby exposing a portion of the thin alumina film; and (e) removing an exposed portion of said thin alumina film by an ion beam etching technique using a carbon fluoride gas, while using said thin metal film as a mask, with an ion accelerating voltage during the ion beam etching technique using a carbon fluoride gas being equal to or greater than 600V.

19. A method of forming a thin film of a predetermined pattern on a desired surface according to claim 18, wherein said thin metal film is thinner than the thin alumina film.

20. A method of forming a thin film of a predetermined pattern on a desired surface according to claim 19, wherein said desired surface is a further metal film.

21. A method of forming a thin film of a predetermined pattern on a desired surface according to claim 20, wherein said thin alumina film is thinner than said further metal film.

22. A method of forming a thin film of a predetermined pattern on a desired surface according to claim 18, wherein the thin metal film is made of a material selected from the group consisting of chromium, iron, nickel and permalloy.

23. A method of forming a thin film of a predetermined pattern on a desired surface according to claim 18, wherein after removing an exposed portion of the thin metal film and before removing an exposed portion of the thin alumina film, the photoresist film is removed.

* * * * *